(12) United States Patent
de Cremoux

(10) Patent No.: US 10,778,094 B2
(45) Date of Patent: Sep. 15, 2020

(54) SYSTEM AND METHOD FOR CONTROLLING A CHARGE PUMP

(71) Applicant: Dialog Semiconductor (UK) Limited, London (GB)

(72) Inventor: Guillaume de Cremoux, Edinburgh (GB)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/724,522

(22) Filed: Dec. 23, 2019

(65) Prior Publication Data

US 2020/0127560 A1 Apr. 23, 2020

Related U.S. Application Data

(62) Division of application No. 16/135,687, filed on Sep. 19, 2018.

(51) Int. Cl.
| | |
|---|---|
| *H02M 3/07* | (2006.01) |
| *H03F 3/187* | (2006.01) |
| *H03G 3/30* | (2006.01) |
| *H02M 1/00* | (2006.01) |

(52) U.S. Cl.
CPC .............. *H02M 3/07* (2013.01); *H03F 3/187* (2013.01); *H03G 3/3031* (2013.01); *H03G 3/3089* (2013.01); *H02M 2001/0003* (2013.01); *H02M 2001/0083* (2013.01); *H03F 2200/03* (2013.01)

(58) Field of Classification Search
CPC ........ H02M 3/07; H03F 3/187; H03G 3/3031; H03G 3/3089

USPC .......................................................... 327/536
See application file for complete search history.

(56) References Cited

U.S. PATENT DOCUMENTS

| | | | |
|---|---|---|---|
| 7,764,525 B2* | 7/2010 | Hsieh ....................... | H02M 3/07 327/536 |
| 2007/0146051 A1* | 6/2007 | Tsen ........................ | H05B 45/37 327/536 |
| 2010/0060343 A1* | 3/2010 | Saitoh .................... | H02M 3/073 327/536 |

(Continued)

OTHER PUBLICATIONS

Co-pending, U.S. Appl. No. 16/135,687, filed Sep. 19, 2018, "A System and Method for Controlling a Charge Pump," by Guillaume De Cremoux, 37 pages.

*Primary Examiner* — William Hernandez
(74) *Attorney, Agent, or Firm* — Saile Ackerman LLC; Stephen B. Ackerman

(57) ABSTRACT

A charge pump controller for controlling a charge pump adapted to convert an input voltage into an output voltage with a conversion ratio is presented. The charge pump is operable in a plurality of modes corresponding to different conversion ratios. The controller includes a first selector for selecting a mode of operation of the charge pump. The first selector comprises a first input for coupling to a voltage supply; and a second input for coupling to a source signal. The first selector identifies a target value of the output voltage. The selector calculates a product of the conversion ratio and the input voltage. The selector compares the product with the target value and selects a mode of operation of the charge pump by increasing or decreasing the conversion ratio based on the comparison. The selector maintains the conversion ratio for a length of time before decreasing the conversion ratio.

17 Claims, 11 Drawing Sheets

(56) References Cited

U.S. PATENT DOCUMENTS

| | | | | |
|---|---|---|---|---|
| 2010/0237833 A1* | 9/2010 | Abe | ............... | H02M 3/07 |
| | | | | 320/166 |
| 2012/0049917 A1* | 3/2012 | Cook | ............... | H02M 3/07 |
| | | | | 327/170 |
| 2014/0132327 A1* | 5/2014 | Liao | ............... | H03K 5/088 |
| | | | | 327/316 |
| 2015/0288278 A1* | 10/2015 | Shao | ............... | G11C 16/14 |
| | | | | 327/536 |
| 2019/0296630 A1* | 9/2019 | Low | ............... | H02H 3/066 |

\* cited by examiner

SYSTEM AND METHOD FOR CONTROLLING A CHARGE PUMP

This is a Divisional application of U.S. patent application Ser. No. 16/135,687, filed on Sep. 19, 2018 which is herein incorporated by reference in its entirety, and assigned to a common assignee.

TECHNICAL FIELD

The present disclosure relates to a charge pump controller and a method of operating a charge pump. In particular, the present disclosure relates to charge pump controller for use with an audio amplifier.

BACKGROUND

Audio amplifiers, such as class-D amplifiers may be used in various signal amplification circuits. The audio amplifier requires an input voltage that can be above the voltage of the battery powering the signal amplification circuit. For this reason, a boost circuit is provided for increasing the battery voltage above a certain reference voltage. The reference voltage may be constant or may vary dynamically to track the audio signal.

The boost circuit can be implemented as an inductive or a capacitive converter. Capacitive converters such as capacitive multipliers have a smaller size than inductive converters and for this reason are often preferred. However, current systems based on capacitive multipliers are sensitive to variations in the battery voltage. For instance, if the audio signal increases, the audio amplifier may require more power and deplete the battery. Such changes in battery voltage lead to significant variations in the voltage generated by the capacitive converter, which in turn reduces the quality of the audio signal.

SUMMARY

It is an object of the disclosure to address one or more of the above-mentioned limitations. According to a first aspect of the disclosure there is provided a method of controlling a charge pump for converting an input voltage into an output voltage with a conversion ratio, the charge pump being operable in a plurality of modes corresponding to different conversion ratios, the method comprising the steps of identifying a target value of the output voltage; calculating a product of the conversion ratio and the input voltage; comparing the product with the target value; and selecting a mode of operation of the charge pump by increasing or decreasing the conversion ratio based on the comparison; and maintaining the conversion ratio associated with the selected mode of operation for a length of time before decreasing the conversion ratio.

For instance, the length of time may be a pre-set value or a programmable value.

Optionally, the conversion ratio may be an integer.

Optionally, the method comprises identifying a plurality of products for different values of the conversion ratio, and selecting a conversion ratio associated with a product that is the closest to the target value. The product closest to the target value may be less than the target value, equal to the target value or greater than the target value.

Optionally, the conversion ratio corresponds to a product that is equal or greater than the target value.

Optionally, the target value may vary with time and identifying the target value comprises sensing a source signal to estimate the target value.

For example, the target value may be proportional to the source signal. The source signal may be an audio signal such a digital audio signal.

Optionally, the method comprises recording amplitude maxima of the source signal.

Optionally, the method comprises calculating a ratio of the product over the target value to select the mode of operation.

Optionally, the method further comprises detecting a rate of change of an input signal function of the input voltage; and upon identifying that a magnitude of the rate of change has crossed a threshold value, generating a reference signal, comparing the output voltage with the reference signal; and selecting a mode of operation of the charge pump based on the comparison.

Optionally, the reference signal is varying with a rate of change that is less than a rate of change of the input signal.

According to a second aspect of the disclosure, there is provided a charge pump controller for controlling a charge pump adapted to convert an input voltage into an output voltage with a conversion ratio, the charge pump being operable in a plurality of modes corresponding to different conversion ratios, the controller comprising a first selector for selecting a mode of operation of the charge pump; the first selector comprising a first input for coupling to a voltage supply proving the input voltage; and a second input for coupling to a source signal; the first selector being configured to identify a target value of the output voltage; calculate a product of the conversion ratio and the input voltage; compare the product with the target value; and select a mode of operation of the charge pump by increasing or decreasing the conversion ratio based on the comparison; and maintaining the conversion ratio associated with the selected mode of operation for a length of time before decreasing the conversion ratio.

Optionally, the conversion ratio may be an integer.

Optionally, the first selector is configured to identify a plurality of products for different values of the conversion ratio, and to select a conversion ratio associated with a product that is the closest to the target value.

Optionally, the first selector is configured to calculate the target value based on the source signal.

Optionally, the first selector is configured to record amplitude maxima of the source signal.

Optionally, the charge pump controller as claimed further comprises a slew rate detector adapted to detect a rate of change of an input signal function of the input voltage and to generate a reference signal upon identifying that a magnitude of the rate of change has crossed a threshold value; a comparator adapted to compare the output voltage with the reference signal; and a second selector to select a mode of operation of the charge pump based on the comparison.

Optionally, the charge pump controller, further comprises a multiplexer having a first channel coupled to the first selector and a second channel coupled to the comparator; the multiplexer being adapted to select the first channel upon receipt of a signal from the slew rate detector.

Optionally, the charge pump controller further comprises a sensor coupled to the slew rate detector; the sensor being adapted to sense an amplitude of the source signal and to enable the slew rate detector upon identifying that the amplitude is below a certain value.

The charge pump controller according to the second aspect of the disclosure may comprise any of the features described above in relation to the method according to the first aspect of the disclosure.

According to a third aspect of the disclosure, there is provided an audio system comprising a charge pump controller as defined in the second aspect of the disclosure, the charge pump controller being coupled to a charge pump and an amplifier coupled to the charge pump for amplifying the source signal; wherein the source signal is an audio signal.

Optionally, the audio system comprises a processor for processing the audio signal, wherein the first selector of the charge pump controller is connected to the processor.

The audio system according to the third aspect of the disclosure may share features of the second aspect, as noted above and herein.

According to a fourth aspect of the disclosure, there is provided a method of controlling a charge pump for converting an input voltage into an output voltage with a conversion ratio, the charge pump being operable in a plurality of modes corresponding to different conversion ratios, the method comprising the steps of detecting a rate of change of an input signal function of the input voltage; generating a reference signal upon identifying that a magnitude of the rate of change has crossed a threshold value; comparing the output voltage with the reference signal; and selecting a mode of operation of the charge pump based on the comparison.

Optionally, the reference signal is varying with a rate of change that is less than a rate of change of the input signal.

Optionally, the method comprises selecting the mode of operation to reduce the output voltage upon identifying that the output voltage is greater than the reference signal and selecting the mode of operation to increase the output voltage upon identifying that the output voltage is less than the reference signal.

Optionally, the plurality of modes comprises integer modes in which the conversion ratio is a fixed integer; and transition modes in which the conversion ratio varies between two integers.

Optionally, wherein the input signal is a multiple of the input voltage.

According to a fifth aspect of the disclosure, there is provided a charge pump controller for controlling a charge pump adapted to convert an input voltage into an output voltage with a conversion ratio, the charge pump being operable in a plurality of modes corresponding to different conversion ratios, the charge pump controller comprising a slew rate detector adapted to detect a rate of change of an input signal function of the input voltage and to generate a reference signal upon identifying that a magnitude of the rate of change has crossed a threshold value; a comparator adapted to compare the output voltage with the reference signal; and a selector to select a mode of operation of the charge pump based on the comparison.

Optionally, the reference signal is varying with a rate of change that is less than a rate of change of the input signal.

Optionally, the selector is adapted to select the mode of operation to reduce the output voltage upon identifying that the output voltage is greater than the reference signal and to select the mode of operation to increase the output voltage upon identifying that the output voltage is less than the reference signal.

Optionally, the selector comprises a state machine operable between a plurality of states, each state corresponding to a specific mode of operation of the charge pump.

Optionally, the selector further comprises a multiplexer coupled to the state machine.

Optionally, the charge pump controller comprises a multiplier adapted to generate the input signal as a multiple of the input voltage.

Optionally, the charge pump controller further comprises a sensor coupled to the slew rate detector; the sensor being adapted to sense an amplitude of the source signal and to enable the slew rate detector upon identifying that the amplitude is below a certain value.

The charge pump controller according to the fifth aspect of the disclosure may comprise any of the features described above in relation to the method according to the fourth aspect of the disclosure.

According to a six aspect of the disclosure there is provided an audio system comprising a charge pump controller as defined according to the fifth aspect, the charge pump controller being coupled to a charge pump; and an amplifier for amplifying the source signal coupled to the charge pump; wherein the source signal is an audio signal.

The audio system according to the six aspect of the disclosure may share features of the fifth aspect, as noted above and herein.

BRIEF DESCRIPTION OF THE DRAWINGS

The disclosure is described in further detail below by way of example and with reference to the accompanying drawings, in which.

DESCRIPTION

Figure 1:
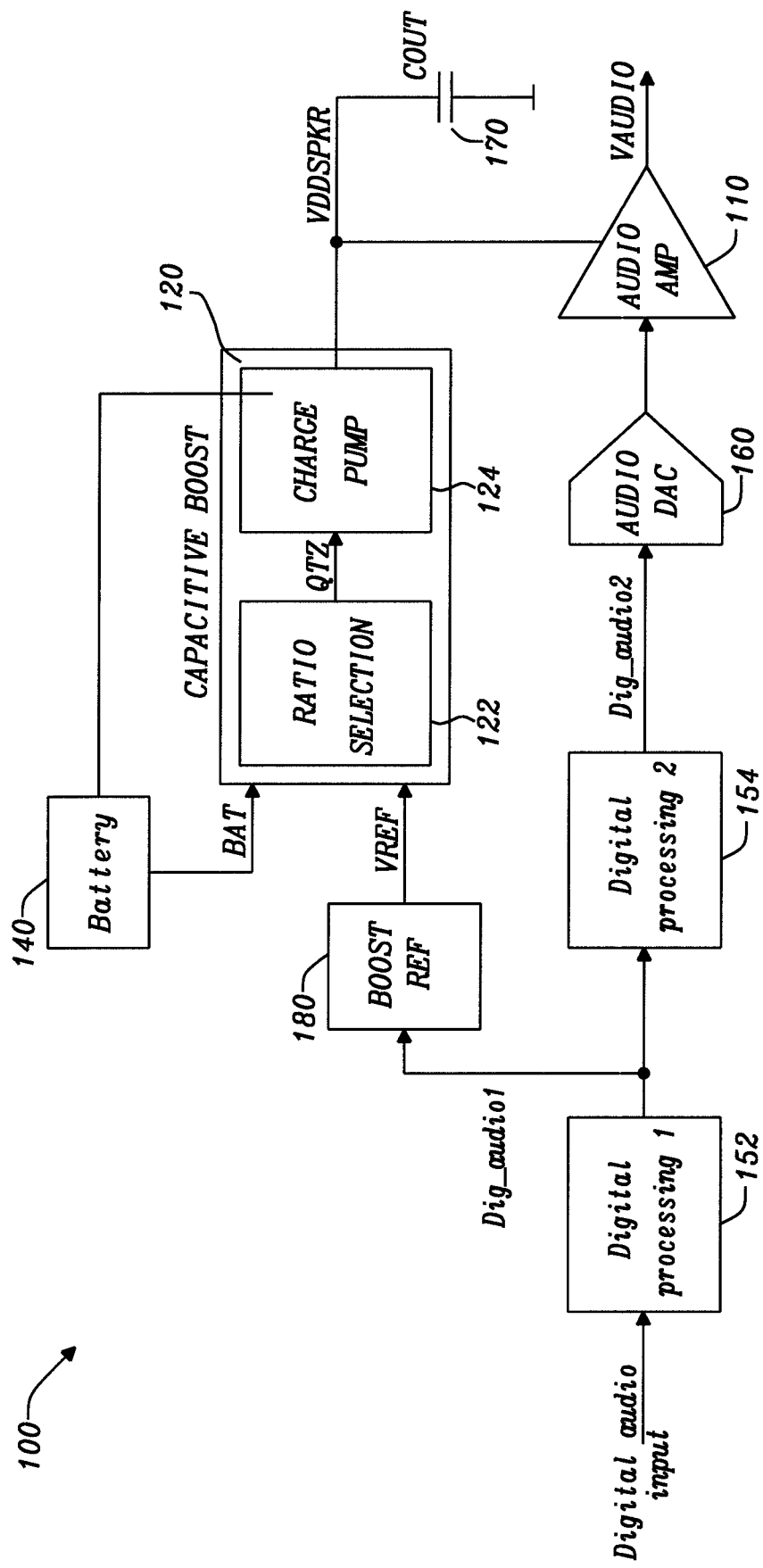
FIG. 1 is a diagram of an audio circuit.

FIG. 1 illustrates a system 100 for amplifying an audio signal. The system 100 includes an audio amplifier 110, a capacitive boost circuit 120, a battery 140, a boost reference circuit 180, a pair of digital processing units referred to as first unit 152, and second unit 154, an audio digital to analog converter 160 and an output capacitor 170. The capacitive boost circuit 120 is used to provide a supply voltage VDD_speaker to the audio amplifier 110. The capacitive boost circuit includes a ratio selection circuit 122 connected to a charge pump 124. The digital processing unit 152 has an input for receiving a digital audio input and an output connected to the boost reference circuit 180 and to the second digital processing circuit 154. The output of the second digital processing unit 154 is connected to the audio amplifier 110 via the audio DAC 160. The ratio selection circuit 122 has a first input for receiving a battery voltage and a second input for receiving a voltage reference provided by the boost reference unit 180. The charge pump 124 has an input connected to the battery 140 and an output connected to the audio amplifier 110. When the audio amplifier 110 is a class-D amplifier, the system 100 may be referred to as a class-H amplifier.

In operation, the digital audio input is processed by the digital processing units 152 and 154 and converted to an analog signal which is then provided to the audio amplifier 110. The audio amplifier 110 then amplifies the audio signal which may be sent to a speaker for providing sound waves. The audio amplifier which in this case is a class D amplifier requires a VDD_Speaker voltage of for example 10 volts. The VDD_Speaker voltage is provided by the charge pump 124 by boosting the battery voltage. The boost reference circuit 180 is used to generate a reference voltage Vref from the digital audio signal. When the digital audio signal increases, the voltage Vref increases as well.

Figure 2:
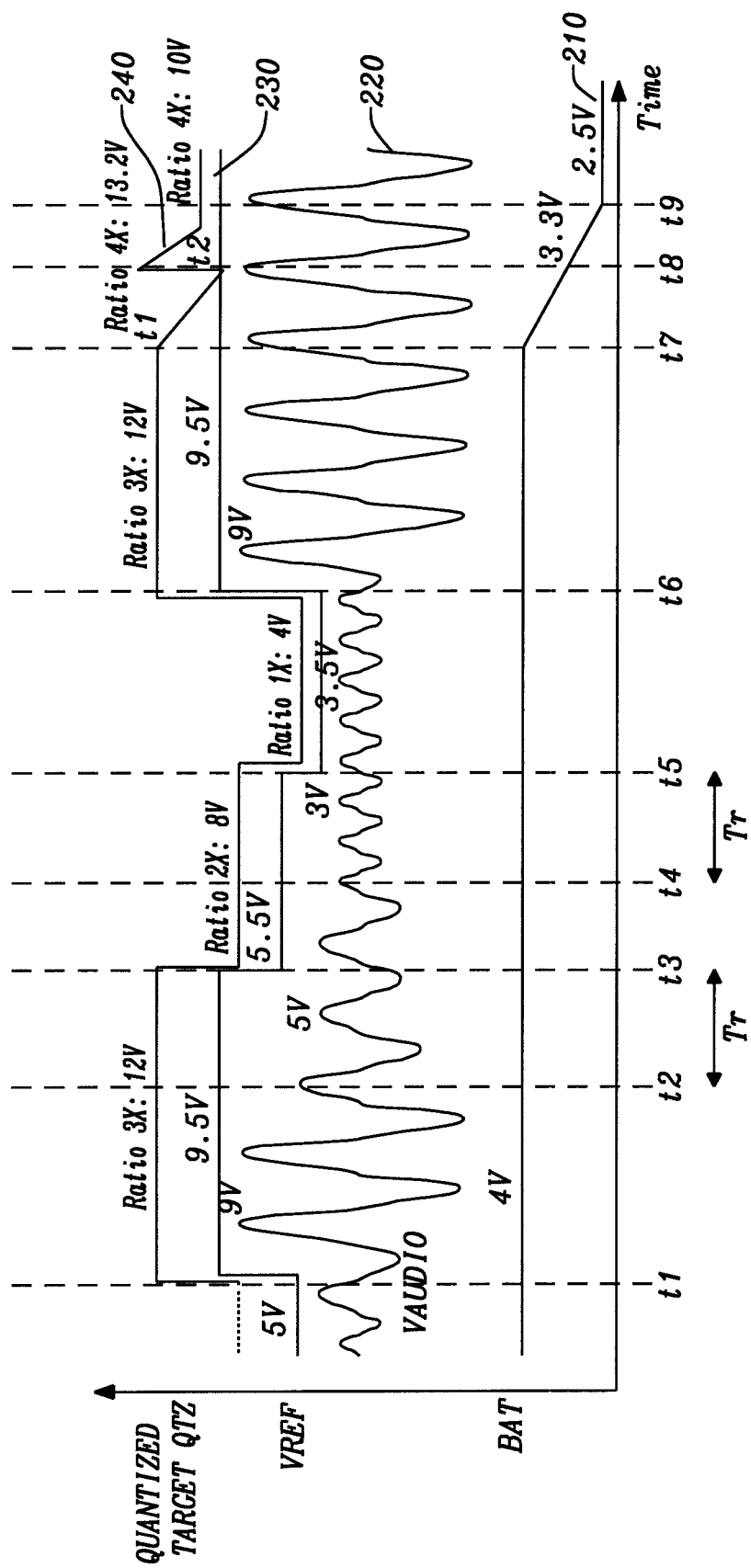
FIG. 2 is a time chart illustrating the working of the circuit of FIG. 1.

FIG. 2 is a time chart illustrating the working of the system 100 of FIG. 1. FIG. 2 shows the battery voltage 210, the output of the audio amplifier VAUDIO 220, the reference voltage 230, and the ratio selection signal, also referred to as Quantized Target signal QTZ 240.

The voltage reference Vref 230 is used as a target value that must be provided by the charge pump. Stated another way, the voltage VDD_speaker provided by the charge pump must be equal to, or greater than, the voltage Vref. The ratio selection circuit 122 compares the battery voltage 210 with the reference voltage 230 and outputs the quantized selection signal QTZ 240 to achieve VDD_speaker greater than or equal to Vref. The reference voltage Vref increases with a non-infinite rate called the attack rate, and when the audio activity requires less power, a release time Tr is used before reducing the activity of the circuit.

Before time t1, the audio signal increases over a couple of periods. The boost reference circuit 180 detects this increase and at time t1 increases the reference voltage from 5V to 9.5 V. For example, the boost reference circuit 180 may monitor the amplitude of the audio signal and record the local maxima or crests values; and increase Vref accordingly.

At time t2, the amplitude of oscillation of the audio signal starts decreasing, however the reference signal remains constant at 9.5V until time t3. The period between times t2 and t3 defines a so-called release time Tr during which the reference signal remains constant. Once this release time has expired, the reference voltage Vref 230 decreases to 5.5V.

Between the times t2 and t3, Vref 230 remains constant at 9.5V and the quantized signal 240 equals 3× the battery voltage, hence 12V, in order to satisfy the condition:

$$Vdd\_Speaker = N * \text{Battery voltage} > Vref \quad (1)$$

in which N is an integer.

At time t4, the amplitude of oscillation of the audio signal decreases further to about 3V. The voltage reference remains constant at 5.5V for the release time Tr, until time t5.

Between the times t3 and t5, Vref remains constant at 5.5V and the quantized signal 240 equals 2× the battery voltage, hence 8V, in order to satisfy the condition of equation (1).

At time t5, the reference voltage decreases to 3.5V and remains constant until time t6. Between the times t5 and t6 the quantized signal 240 equals 1× the battery voltage, hence 4V, in order to satisfy the condition of equation (1).

At time t6, the amplitude of oscillation of audio signal increases to 9V. The voltage reference Vref increases to 9.5V and remains constant. Between the times t6 and t7 the quantized signal 240 is equal to 3× the battery voltage, hence 12V, in order to satisfy the condition of equation (1).

At time t7 the battery voltage 210 starts decreasing and as a result, the QTZ signal 240 also decreases. At time t8, the battery voltage is 3.3V and the ratio selector switches from 3× to 4× the battery voltage to reach 13.2V (4×3.3) to maintain the condition of equation (1) as the voltage battery keeps decreasing further.

In another scenario, the battery voltage may decrease, for example from 4V to 3.5V with a fall time of 10 microseconds and then later rises back to 4V, again with a rise time of 10 microseconds. In this instance, the variation in battery voltage from 4V to 3.5V would result in a variation of the VDD_speaker voltage, going from 12V to 10.5V, when the charge pump is operated with a 3× conversion ratio. Therefore, the variation in VDD_speaker would be three times larger than the variation of the battery voltage. Consequently, the audio amplifier cannot reject the sharp and large ripples of the battery voltage, which becomes audible; hence affecting the quality of the audio signal provided by the speaker.

Figure 3:
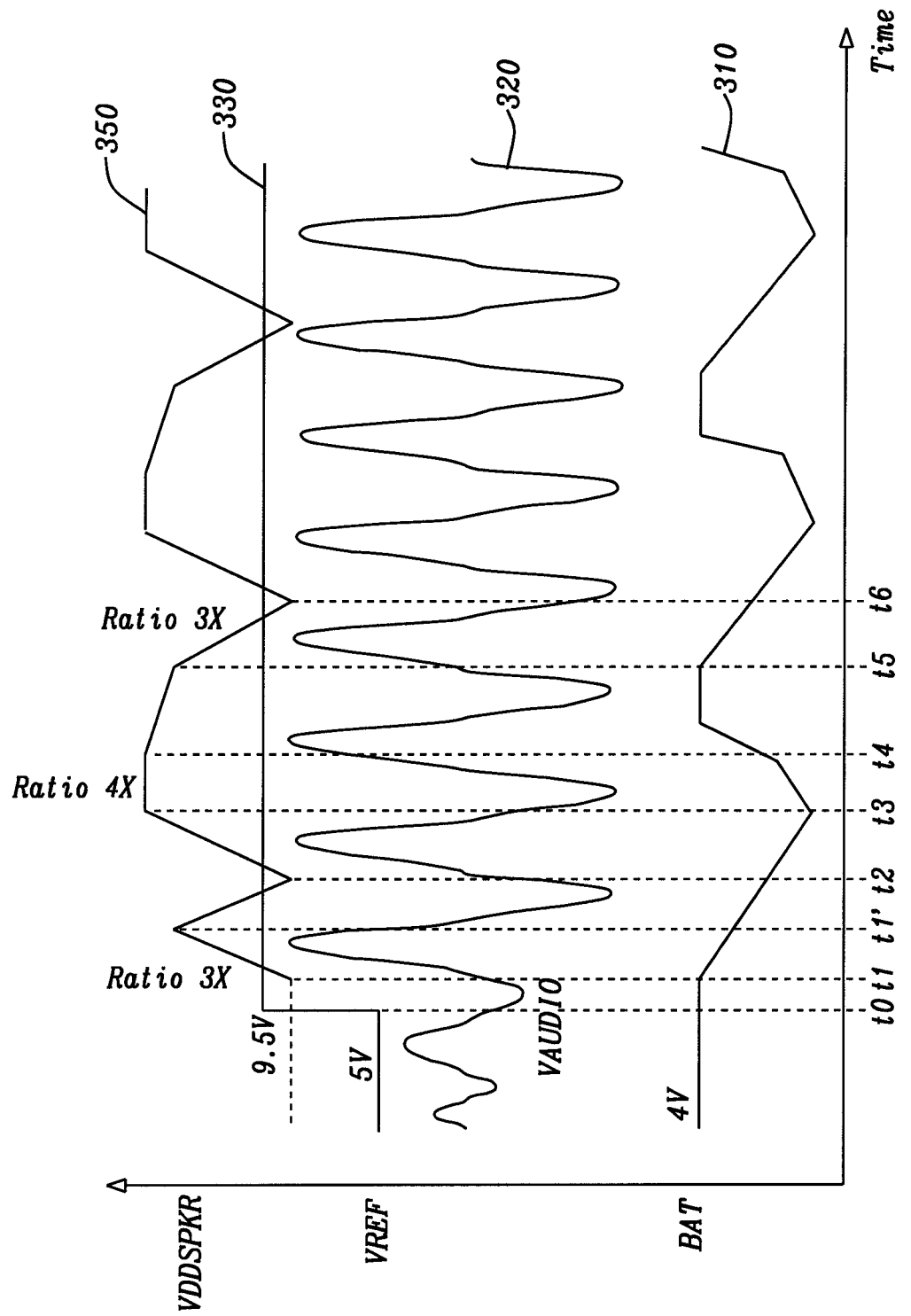
FIG. 3 is another time chart illustrating the working of the circuit of FIG. 1.

FIG. 3 presents another set of waveforms for illustrating the working of FIG. 1, including the battery voltage 310, the audio signal 320, the reference voltage 330 and the VDD_speaker voltage 350.

At time t0, the reference voltage 330 increases from 5V to 9.5V consecutive to an increase in the amplitude of oscillation of the audio signal.

At time t1, the quantized signal QTZ switches the conversion ratio from 2× to 3× the battery voltage and the VDD_speaker 350 starts increasing.

As the power of the audio signal increases, more current is required from the battery 140. Since the battery 140 has an equivalent series resistance ESR, the battery voltage decreases. At time t1' the VDD_speaker voltage 310 decreases due to the decrease in battery voltage.

At time t2, the battery voltage 310 reaches a level that triggers an increase in the conversion ratio from 3× to 4× the battery voltage. As a result, VDD_speaker 350 stops decreasing; however, at this point more current is needed from the battery to ramp up the output capacitor 170 and the battery voltage keeps decreasing further until time t3, at which point no more current is used to ramp up Cout 170 and the battery voltage starts increasing.

At time t4 the battery voltage 310 is back to a level that is sufficiently high to allow the conversion ratio to be reduced to 3× the battery voltage. The battery voltage 310 keeps increasing.

At time t5 the charge pump resumes pumping, depleting the battery yet again. When VDD_Speaker exceeds an arbitrary reference value, for example 3Vbat-100 mV, then the charge pump remains inactive, (skipping state) and Cout get discharged. Once VDD_Speaker drops below the reference value then pumping is restarted until a second reference for example (3Vbat-50 mV). If VDD_Speaker keeps increasing the charge pump returns to the skipping state.

At time t6, the battery voltage reaches a level which triggers an increase in the conversion ratio to 4× the battery voltage, hence starting a new cycle of variation of the battery voltage.

As a result, the VDD_speaker voltage 350 displays an oscillatory behaviour with large amplitude variations. Such oscillations are due to the repetitive changes in the mode of operation of the charge pump, in this example between 3× and 4× conversion ratios. Such oscillations affect the quality of the output signal.

Figure 4:
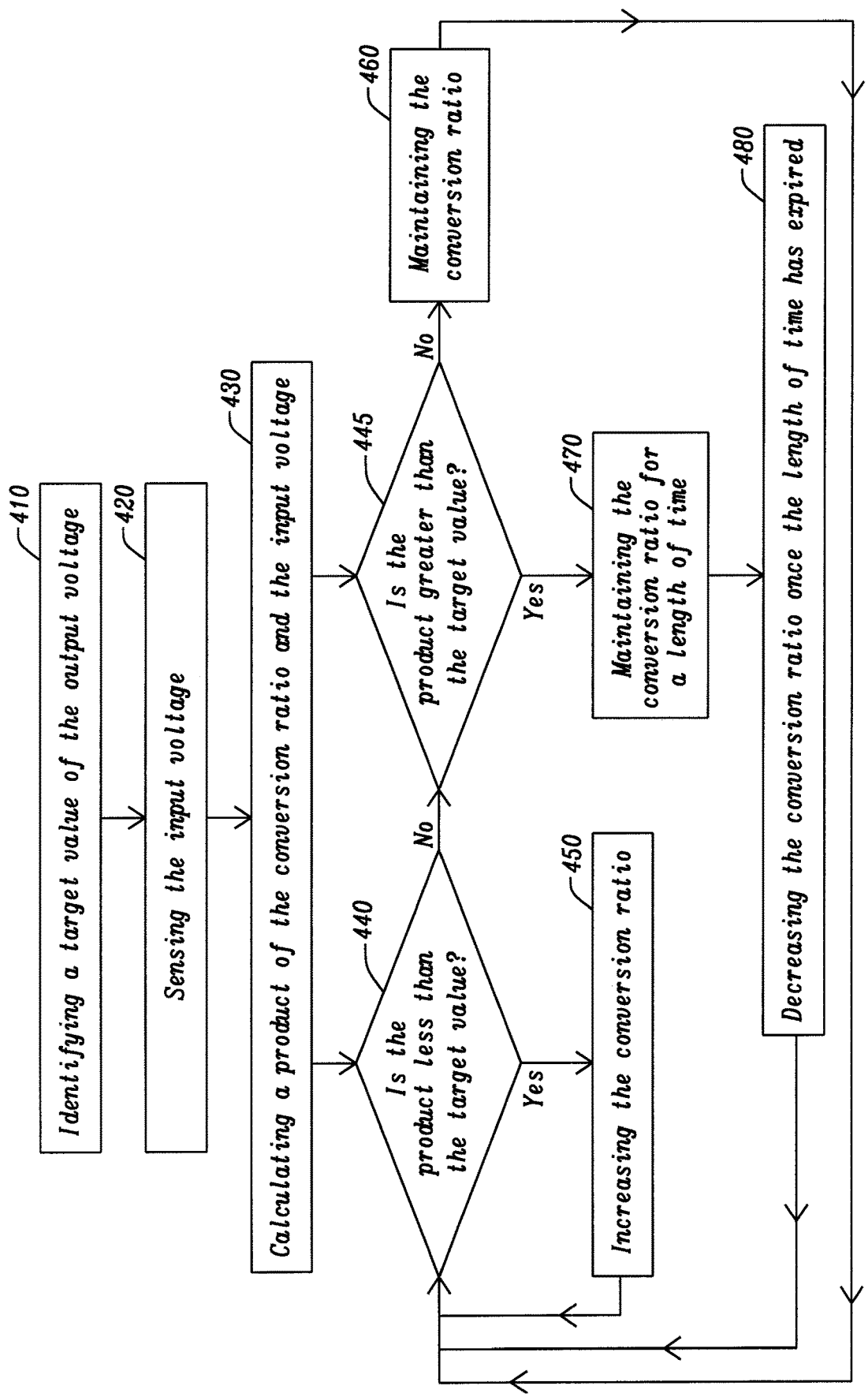
FIG. 4 is a flow chart of a method of operating a charge pump.

FIG. 4 is a flow chart of a method of operating a charge pump for converting an input voltage into an output voltage with a conversion ratio. The charge pump is operable in a plurality of modes corresponding to different conversion ratios.

At step 410, a target value of the output voltage is identified. For instance, the target value may be a pre-set value. For example, the target value may be an operating voltage of a device powered by the charge pump such as an audio amplifier. Alternatively, the target value may be changing over time, depending on the demand placed on the device powered by the charge pump. For instance, if the device is an amplifier for amplifying a source signal, then the target value may depend on an amplitude of the source signal.

At step 420, the input voltage is sensed. For instance, the input voltage may be a battery voltage Vbat. At step 430, a product of the conversion ratio and the input voltage is calculated. At step 440, the product is compared with the target value. Then, a mode of operation of the charge pump may be selected based on the comparison.

If the product is less than the target value, then the conversion ratio may be increased at step 450. If the product is equal to the target value, then the conversion ratio may be either increased or maintained as shown at step 460.

A plurality of products for different values of the conversion ratio may be identified. Then the conversion ratio associated with the product that is the closest to the target value may be selected. Different products may be calculated for a same input voltage and different values of conversion ratios. Alternatively, pre-calculated product values may be stored in a register. The product that is the closest to the target value may be less than the target value, or equal to the target value or greater than the target value.

In a first numerical example, if the target value is 10V, and the input voltage Vbat=3V; then the product of the conversion ratio N times Vbat:N.Vbat equals 6V for N=2, 9V for N=3, and 12V for N=4. In this numerical example, the product value the closest to the target value is the product value of 9V corresponding to the conversion ratio N=3. This product value is less than the target value. So, at step 450 the conversion ratio may be increased from N=2 to N=3 if the initial conversion ratio was N=2; or maintained at N=3 if the initial conversion ratio was N=3.

In a second numerical example, the target value is still 10V but the input voltage Vbat=2.5V. In this scenario, the product N.Vbat equals 5V for N=2, 7.5V for N=3, 10V for N=4, and 12.5 for N=5. In this second numerical example, the product value the closest to the target value is the product value of 10V corresponding to N=4. This product value is equal to the target value.

Depending on the application, the selection of the conversion ratio may further require that the conversion ratio corresponds to a product that is equal or greater than the target value. Referring back to the first numerical example, the first conversion ratio that corresponds to a product value equal or greater than the target value is N=4.

If the product is greater than the target value at step 445, the conversion ratio is maintained for a length of time also referred to as release time at step 470 and then the conversion ratio is decreased once the release time has expired at step 480. The release time may be a pre-set length of time. For instance, the release time may be tens of milliseconds. The release time may be reset to zero after a change in conversion ratio; at which point a counter may count from zero up to a defined length of time.

Depending of the implementation, the input voltage, the target value and the product may be digitised to provide digitised values.

Figure 5:
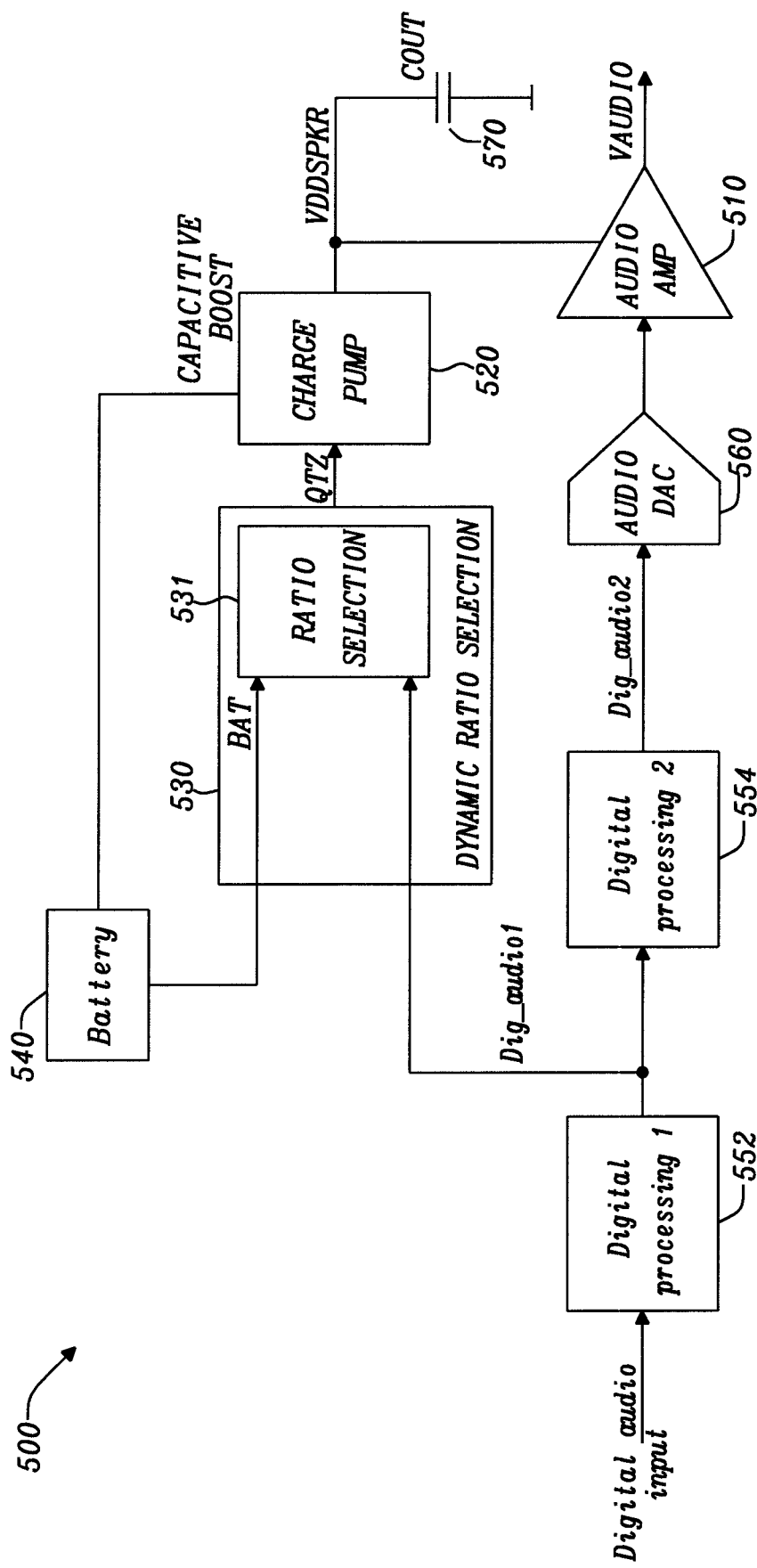
FIG. 5 is a diagram of an audio amplifier circuit implementing the method of FIG. 4.

FIG. 5 describes an audio amplifying system 500 according to the disclosure. The system 500 includes an audio amplifier 510, a charge pump 520, a dynamic ratio selector 530, a battery 540, a set of digital processing units 552, 554, an audio digital to analog converter 560 and an output capacitor 570.

The first digital processing unit 552 has an input for receiving a digital audio signal and an output coupled to the second digital processing unit 554 and to the dynamic ratio selector 530. The audio DAC 560 has an input coupled to the output of the second digital processing unit 554 and an output coupled to the audio amplifier 510. The audio amplifier 510 has a first input coupled to the output of the audio DAC 560 and a second input coupled to the charge pump 520. The output of the audio amplifier may be coupled to a speaker (not shown). The charge pump 520 has a first input coupled to the dynamic ratio selector 530, a second input coupled to the battery and an output coupled to both the output capacitor 570 and to the audio amplifier 510.

The dynamic ratio selector 530 has a ratio selection block 531, which has a first input coupled to the battery 540, a second input coupled to the output of the first digital processing unit 1 552, and an output coupled to the charge pump 520. The ratio selector block 531 is directly connected to the output of the digital processing 552. A timer not shown may be provided to indicate that a release time has expired. The timer may be implemented in different ways. For instance, the timer may be a counter coupled to the dynamic ratio selector 530. The dynamic ratio selector 530 may be implemented in different fashions. For instance, the dynamic ratio selector may be a state machine. A state machine is configured to define a new state based on the knowledge of the previous state and on the input received. Such a state machine may be implemented as a processor configured to run an algorithm or as a binary search circuit.

The digital processing units 552, 554 may be merged into a single unit. In this case the output signal dig_audio2 would be provided to the ratio selector 530.

It will be appreciated that an analog version of the circuit of FIG. 5 may be implemented. In this case the components 552, 554 and 560 may be replaced by an analog filter. However, a smaller circuit size can be achieved when implementing the circuit 500 digitally.

Figure 6:
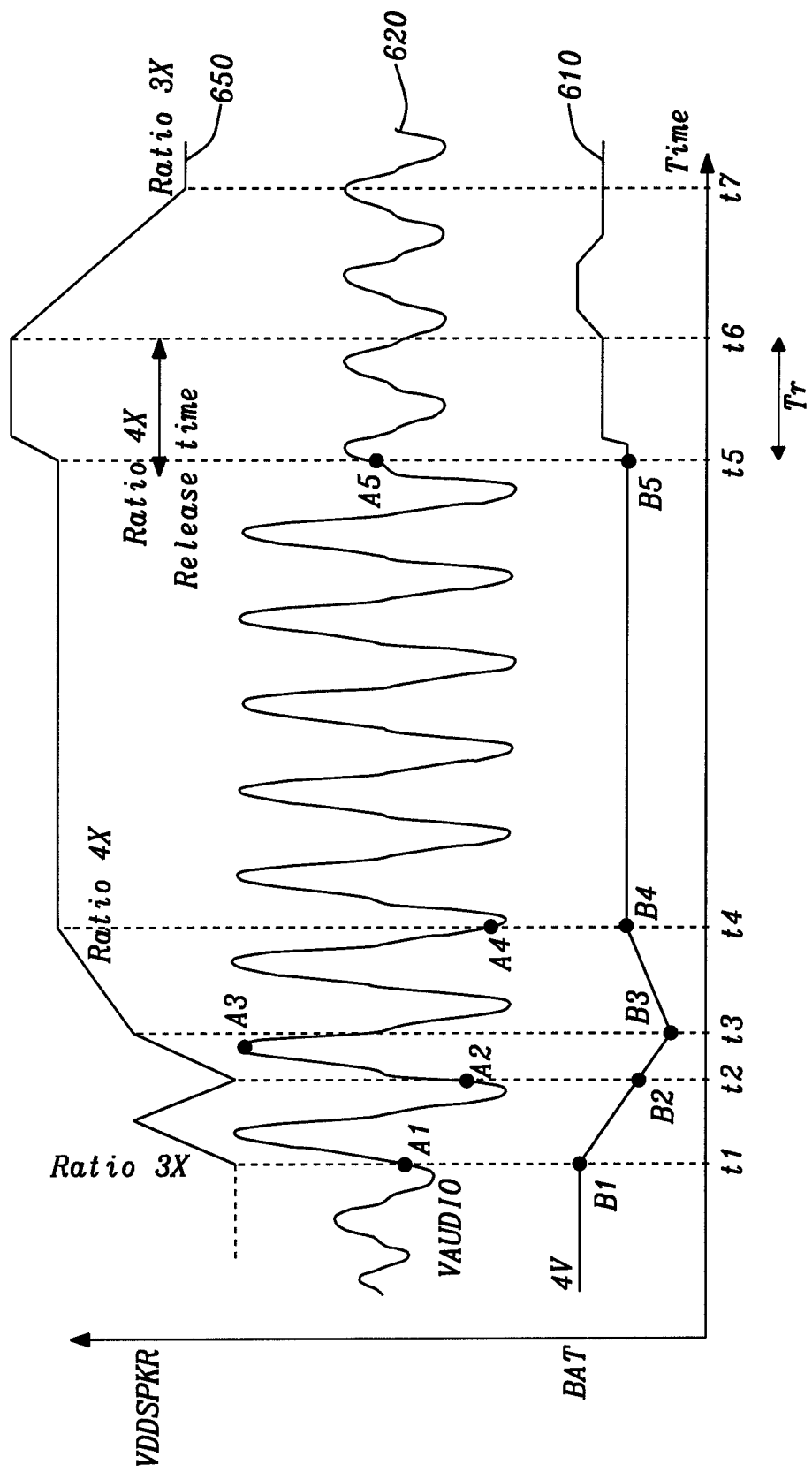
FIG. 6 is a time chart illustrating the working of the circuit of FIG. 5.

FIG. 6 is a time chart illustrating the working of the circuit of FIG. 5. FIG. 6 shows the battery voltage 610, the audio signal Vaudio 620 provided by the audio amplifier 510 and the VDD speaker voltage 650 generated by the charge pump 520. The input audio signal Dig_audio 1, is not represented. The input audio signal is a non-amplified version of Vaudio shifted by a delay, for example −50 μs with respect to the signal Vaudio.

In operation, the digital processing units 552 and 554 may be used to increase the sampling rate of the signal also referred to as upsampling; and also, to perform signal interpolation to create additional data signal. The digital processing units may also be used to filter the digital signal. The second processing unit 554 may introduce a delay. For instance, the second digital processing 554 may introduce a delay time of 50 μs. This means that the output of the audio DAC is known in advance, hence allowing ramping up the voltage VDD_Speaker if required.

The dynamic ratio selector 530 receives a signal Dig_audio1 from the digital processing unit 552, that is a processed version of the input audio signal, and a voltage Vbat from the battery 540. The dynamic ratio selector 530 identifies a mode of operation of the charge pump corresponding to a specific conversion ratio Ni in which Ni is an integer (1, 2, 3, 4 . . . ) at time ti, then calculates a product Pi=Ni.Bi in which Bi is a value of the battery voltage obtained at time ti. Depending on the implementation, the battery voltage may be digitized. The dynamic ratio selector 530 then compares the product Pi with a target value and adjusts the conversion ratio accordingly. In this example, the target value Ai is an estimated value of the signal Vaudio at time ti. The target value may be estimated based on the amplitude of the signal Dig_audio1, and a known gain of the amplifier 510. For instance, the dynamic ratio selector 530 may calculate a ratio of Pi/Ai to identify the integer Ni such that the product $N_i \cdot B_i \geq A_i$.

The battery voltage Vbat and the input audio signal may be sensed continuously, so that the required conversion ratio N can be calculated and if necessary updated in time. The amplitude of the input signal may be measured at a point in time corresponding to a local maximum, also referred to as crest value. As a result, the voltage VDD_speaker (equals to N.Vbat) is maintained at a sufficient level for operating the amplifier.

At time t1, the dynamic ratio selector 530 receives a value B1 from the battery voltage and calculates a product P1=N1*B1. The product P1 is less than a threshold value A1 and the ratio selector 530 increases the conversion ratio from 2× to 3×. For instance, A1 may have an amplitude of 8V measured at a maximum of the input audio signal sinusoidal oscillation. In this case if VBAT=B1=3.8V, then a conversion of N1=3 is required.

Between the times t1 and t2 VDD_Speaker 650 increases while the battery voltage decreases. At time t2, the product P2=3B2 is less than a threshold value A2 and the ratio selector 530 increases the conversion ratio from 3× to 4×.

The dynamic ratio selector 530 may send a reset signal to a timer, for instance a counter, counter to reset the release time. The counter then start counting for a certain length of time, for example 100 ms, and then provides a release signal indicating that to the dynamic ratio selector that the release time has expired. The release time therefore allows the conversion ratio N to remain at its value, in this case 4, for a certain amount of time even if the input signal decreases. The VDD_speaker voltage 650 stops decreasing; however, at this point more current is needed from the battery to ramp up the output capacitor 570 and the battery voltage 610 keeps decreasing until time t3 at which point no more current is used to ramp up Cout 570 and the battery voltage 610 stop decreasing.

At time t3, the product is above the threshold value A3 and the ratio selector maintains a 4× ratio.

At time t4, the battery has returned to an intermediate value, however, the product P4 is such that the ratio is maintained to 4×. As a result, the voltage battery level remains constant until time t5.

At time t5, the amplitude of oscillation of the audio signal decreases, resulting in an increase in Vbat and VDD_Speaker. The product is more than the threshold value A5, however the ratio is maintained constant at 4× for a release time duration Tr. At time t6 the conversion ratio is reduced to 3×.

By updating the conversion ratio based on the product N.Vbat and by maintaining the conversion ratio N for a release time Tr upon identifying a decrease of the input signal, the dynamic ratio selector prevents the VDD_speaker voltage from oscillating.

Figure 7:
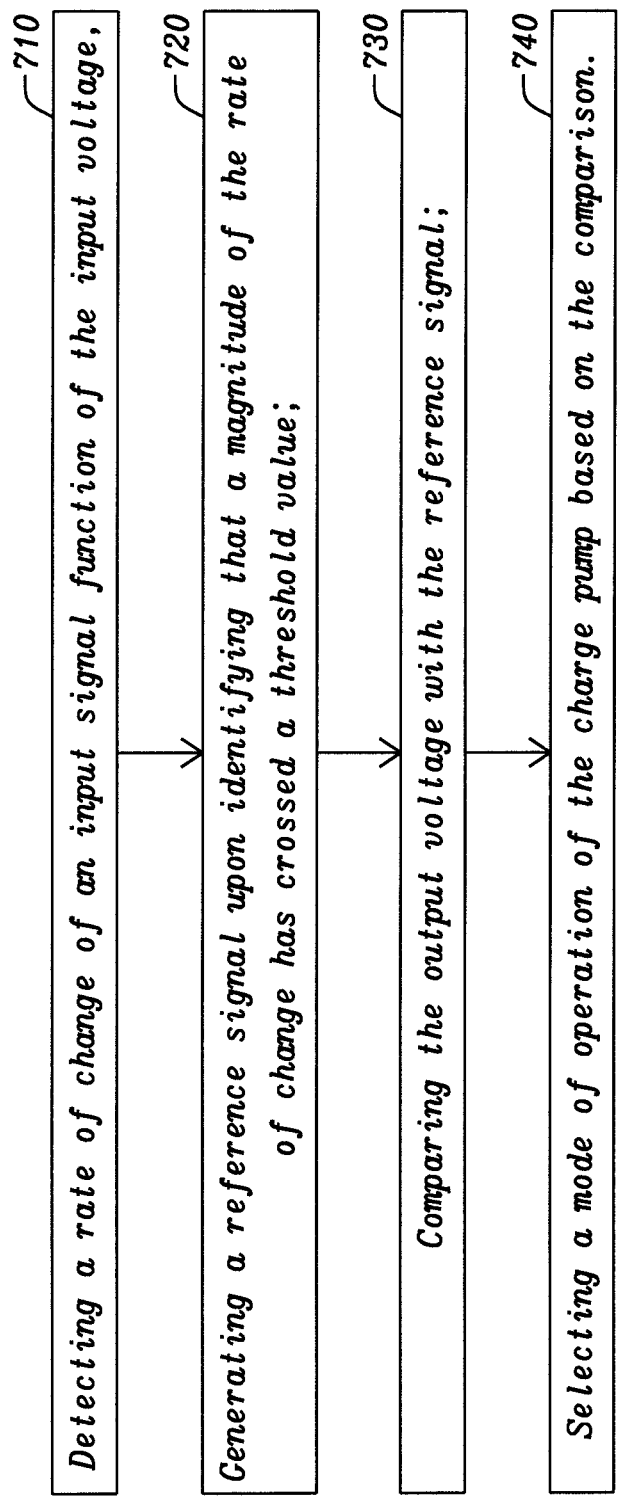
FIG. 7 is a flow chart of another method of operating a charge pump.

FIG. 7 is another flow chart of a method of operating a charge pump for converting an input voltage into an output voltage with a conversion ratio. The charge pump is operable in a plurality of modes corresponding to different conversion ratios.

At step 710, a rate of change of an input signal function of the input voltage is detected. For instance, the input signal may be a multiple of the input voltage. At step 720, a reference signal is generated upon identifying that a magnitude of the rate of change has crossed a threshold value. For instance, if the rate of change corresponds to a decrease in the input voltage, then a reference signal with a negative slope may be generated. Similarly, if the rate of change corresponds to an increase in the input voltage, then a reference signal with a positive slope may be generated. The reference signal may be implemented in different ways with different waveform shapes. In an exemplary embodiment, the reference signal may be a linear function or a staircase function with a periodic increase or a periodic decrease.

At step 730, the output voltage is compared with the reference signal. At step 740 a mode of operation of the charge pump is selected based on the comparison. For instance, if the output voltage is greater than the reference signal, then a mode of operation of the charge pump may be selected to reduce the output voltage. On the contrary if the output voltage is less than the reference signal, then a mode of operation of the charge pump may be selected to increase the output voltage.

Figure 8:
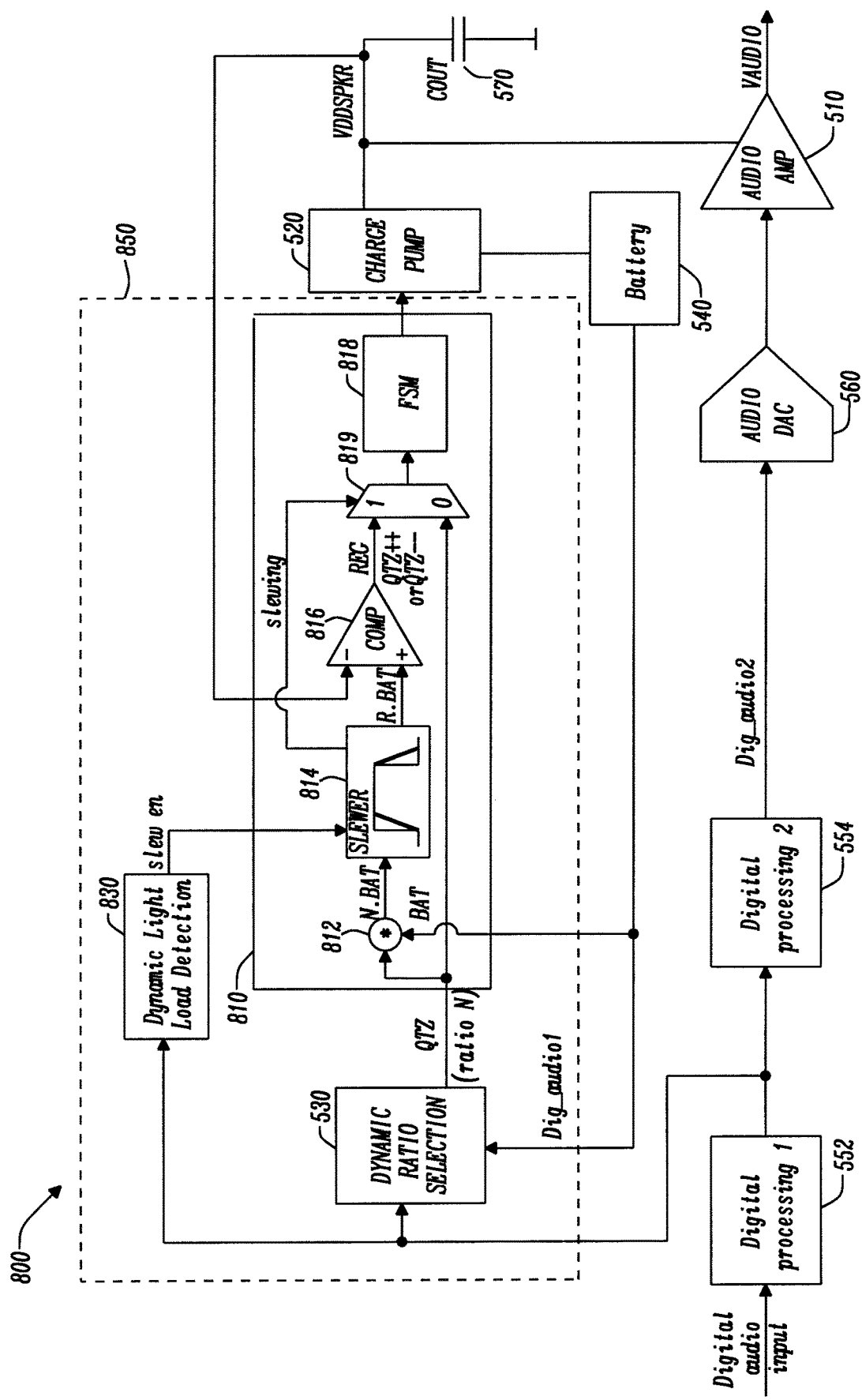
FIG. 8 is a diagram of an audio amplifier circuit comprising a slewer for implementing the method of FIG. 7.

FIG. 8 shows a diagram of an audio circuit 800 for amplifying an audio signal. FIG. 8 shares many similar components to those illustrated in FIG. 5. The same reference numerals have been used to represent corresponding components and their description will not be repeated for the sake of brevity. The audio circuit 800 includes a charge pump controller 850 for implementing the method according to FIG. 7. The charge pump controller 850 includes a first controller 530 for providing a first control signal; and a second controller 810 for providing a second control signal.

In this example, the first controller is provided by the dynamic ratio selector 530 as described with reference to FIG. 5. However, it will be appreciated that the first controller may be implemented by another type of ratio selector, for instance ratio selector 122 described with reference to FIG. 1. Optionally, the charge-pump controller 850 may also include a load detector 830 for enabling the second controller 810. The load detector 830 may be implemented as a comparator for comparing an amplitude of the input signal with a minimum threshold value. If the signal amplitude is less than the threshold value, the load may be referred to as light. The input signal may be a periodic signal having local maxima (crests) and local minima (valleys) and the amplitude of the input signal may be measured at a crest of the input signal.

The circuit 810 includes a multiplier 812, a slew rate detector also referred to as slewer 814, a comparator 816, a mode selector such as a state machine 818, and a multiplexer 819.

The slewer 814 may be implemented digitally. For instance, if the battery voltage Vbat is coded in 8 bits, a battery voltage Vbat of 3.8V would translate into a digital number Dbat=194. If N=3, then the NBAT would translate into a digital number of 582. If the battery voltage varies with a rate of change that exceed a certain threshold, then the slewer 814 changes the slope of the input NVbat to reduce it.

The multiplier 812 has a first input coupled to the dynamic ratio selector 530 and a second input coupled to the battery 540. The slewer 814 has an input coupled to the output of the multiplier 812, and two outputs: a first output coupled to the multiplexer 819 and a second output coupled to the comparator 816. Optionally the slewer 814 may also be provided with a second input for receiving an output of the dynamic light load detector 830. The comparator 816 has a first input, for instance, an inverting input coupled to the output of the charge pump 520 and a second input, for instance, a non-inverting input coupled to the second output of the slewer 814.

The multiplexer 819 has a first input coupled to the output of the comparator 816, a second input coupled to the dynamic ratio selector 530 and a third input coupled to the first output of the slewer 814. The output of the multiplexer is coupled to the final state machine FSM 818.

The FSM 818 has an input for receiving an output of the multiplexer 819 and an output coupled to the charge pump 520. The FSM 818 may also be provided with another input for receiving a signal indicating whether the battery voltage has increased or decreased. This signal may be used by the FSM to increment or decrement the conversion ratio selection upon receipt of the signal provided by the multiplexer.

In operation, the multiplier 812 calculates a product of a ratio N provided by the ratio selector 530 times the battery voltage Vbat; and outputs a signal referred to as N.BAT that varies with time.

The slewer 814 may be enabled by default, for instance upon starting the circuit 800. Alternatively, the slewer 814 may be enabled by the dynamic light load detector 830. For instance, the dynamic light load detector 830 may detects that the circuit 800 is operating in a light load condition and send a logic signal to the slewer to enable it. A light load condition may be identified if an amplitude of the Dig_audio1 signal is below a certain threshold value. Once enabled, the slewer 814 provides two signals, a logic signal also referred to as slewing signal to the multiplexer 819; and a reference signal, also referred to as slope signal, to the comparator.

The slewing signal allows selecting a specific channel of the multiplexer 819. For instance, when the slewing signal is a logic high, for example a logic 1, the multiplexer may enable the channel coupled to the comparator 816. Alternatively, when the slewing signal is low, for example a logic 0, the multiplexer 819 may enable the channel coupled to the dynamic ratio selector 530.

If the slewing signal is low, the FSM 818 receives the selection signal QTZ from the dynamic ratio selector 530. For instance, if QTZ corresponds to a ratio N=3, the FSM will select RATIO3X.

If the slewing signal is high, the FSM 818 receives the regulation signal REG from the comparator 816. In this instance, the FSM identifies the value of the REG signal. For example, if REG=0, then the FSM does not select another mode; however, if REG=1, indicating that VDD_SPKR is not high enough compared to ramp R.BAT, then the FSM 818 select a different mode to ensure that VDD_SPKR eventually tracks R.BAT. Following on the previous example the FSM 818 may change from a RATIO3X to a RATIO4X.

The slewer 814 receives the signal N.BAT from the multiplier 812 and identifies a rate of variation d(N.BAT)/dt of the signal N.BAT over time. If the rate of variation is greater than a threshold value, the slewer 814 generates the reference signal R.BAT associated with a slower rate of variation. The reference signal is time-dependent and may be defined by the product of a number R and the battery voltage Vbat; in which R is a real number that increases or decreases with time. In an exemplary embodiment the threshold value of the rate of variation may be set to 1V/ms. In this instance, the reference signal may be generated if d(N.BAT)/dt exceeds 1V/ms.

Figure 9:
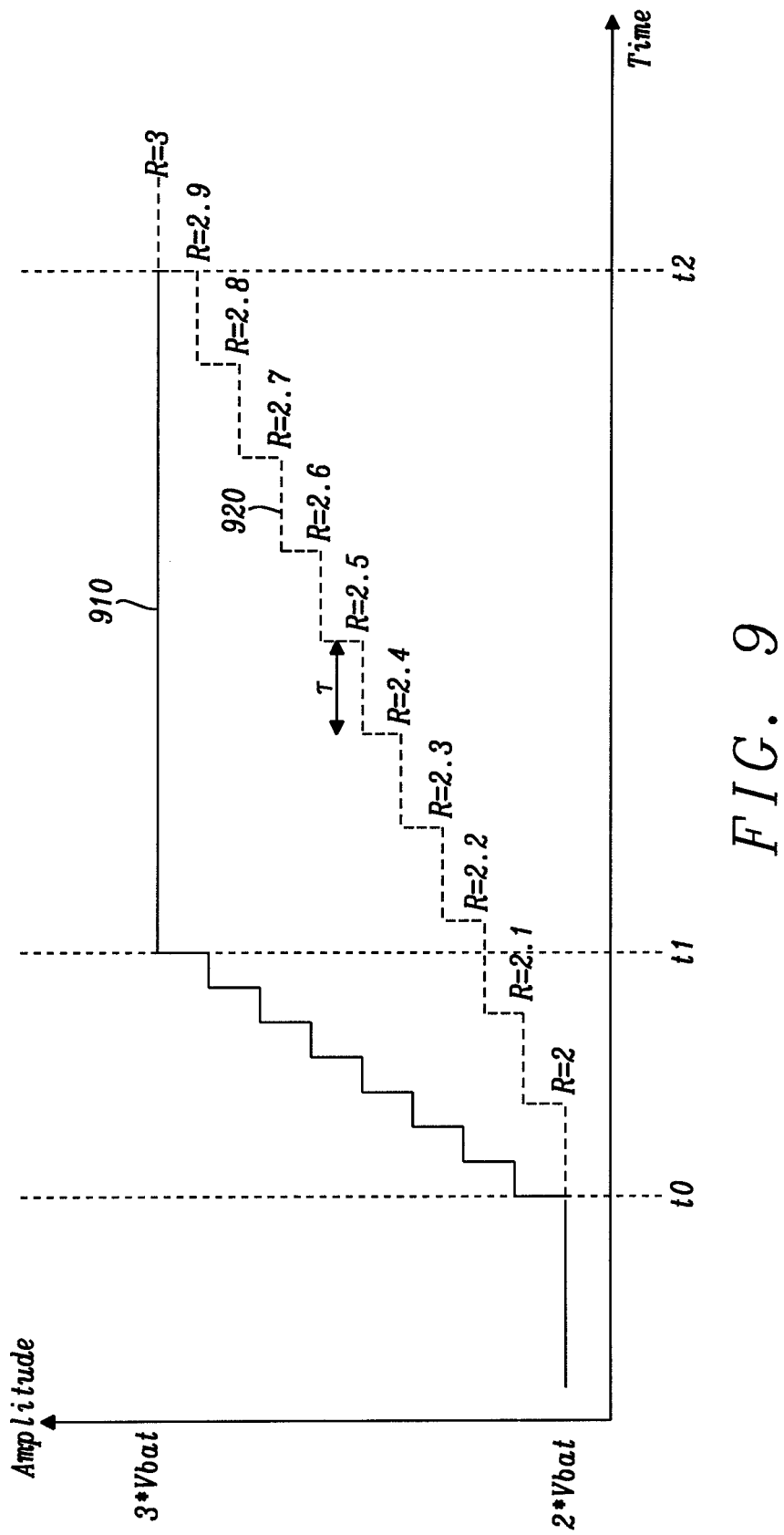
FIG. 9 is a diagram showing a waveform proportional to a battery voltage and a reference signal generated by the slewer of FIG. 8.

FIG. 9 illustrates the output signal N.BAT 910 provided by the multiplier 812, and the reference signal R.BAT 920 provided by the slewer 814. In this example, the waveform 910 varies from a first level having a value of 2Vbat at time t0, to a second level having a value 3Vbat at time t1. To simulate a slower variation, the slewer 814 generates the reference signal 920. In this example the slope signal is provided by a staircase function having a periodic increase. The value R increases at a given frequency defined by a time interval T, from R=2 to R=3. The waveform 920 reaches the second level at a later time t2>t1.

The value of R increases incrementally by a fixed incremental value at every time interval T. In the present example the incremental value is set to 0.1. The incremental value may be a pre-set value. By changing the incremental value and/or the time interval T, the slope of the slope signal can be adjusted and therefore the duration of the slope signal. The incremental value and the time internal define a step which may be programmable.

Referring back to FIG. 8, the comparator 816 then compares the reference signal with VDD_speaker provided by the charge pump 520. The comparator 816 then provides a regulation signal REG to the FSM 818 via the multiplexer 819. This regulation signal may be a logic signal, such as a logic high or logic low to select a mode stored in the FSM 818.

The final state machine 818 may be configured to store a plurality of modes for operating the charge pump 520. These modes may include both integer modes corresponding to N times the battery voltage in which N is an integer as well as transition modes for passing between integer modes. Upon receipt of the regulation signal, the FSM 818 selects a particular mode and outputs a control signal to the charge pump 520 for operating the charge pump with a specific conversion ratio.

Figure 10:
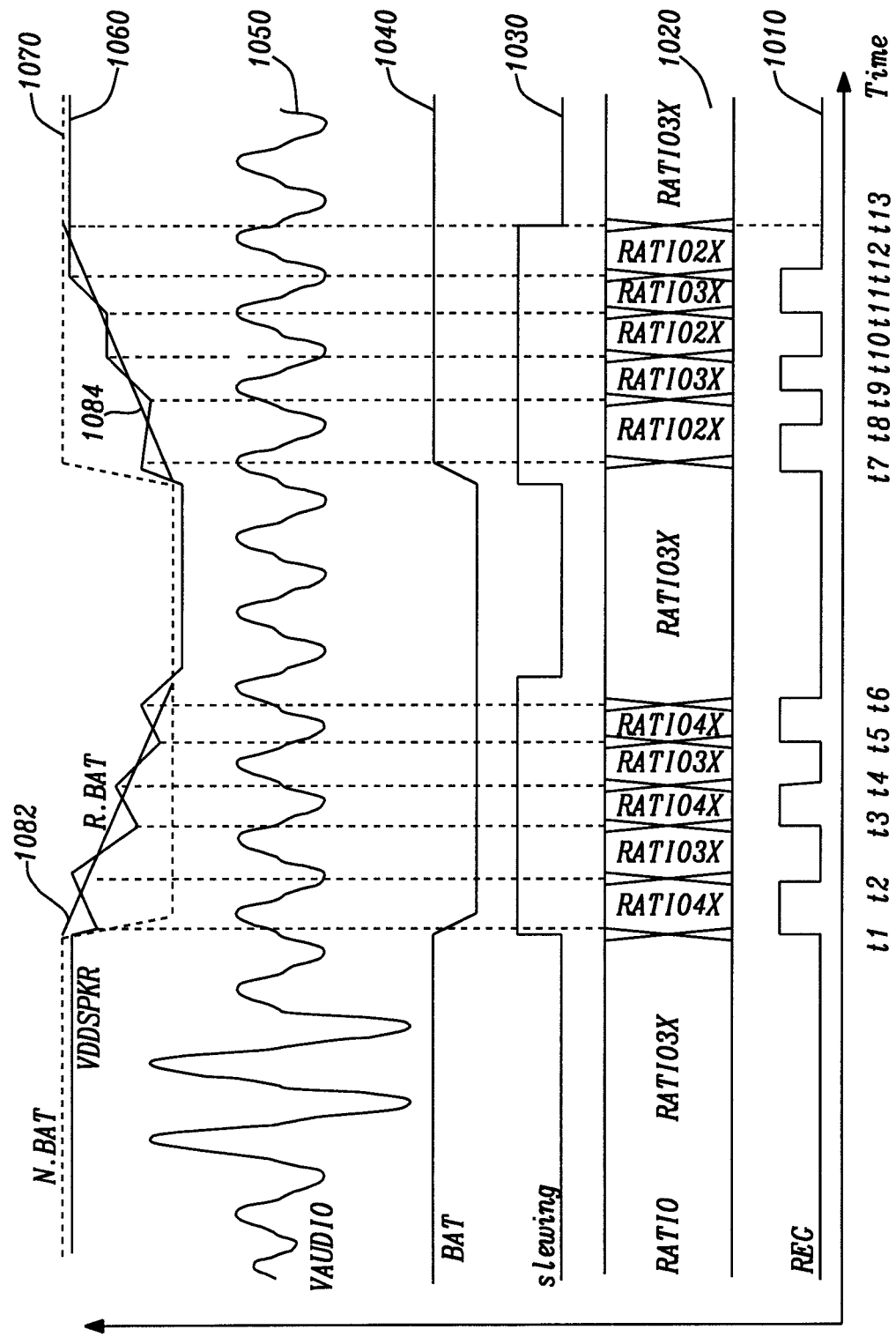
FIG. 10 is a time chart illustrating the working of the circuit of FIG. 8.

FIG. 10 is a time chart illustrating the working of the circuit of FIG. 8. The chart includes the regulation signal 1010 provided by the comparator 816, a conversion ratio state 1020 of the control signal also referred to as operating ratio signal provided by the FSM 818, the slewing signal 1030 provided by the slewer 814, the battery voltage 1040, the audio signal Vaudio 1050, the output voltage VDD speaker 1060 provided by the charge pump, the output signal 1070 of the multiplier 812; and the reference signals 1082, 1084 generated by the slewer 814.

The circuit 800 can operate between two modes: a first mode also referred to as normal mode, in which the FSM 818 receives a ratio selection signal QTZ from a ratio selector such as the dynamic ratio selector 530 and a second mode, referred to as slew mode, in which the FSM 818 receives the regulation signal REG from the comparator 816.

Initially, before time t1 the circuit 800 operates in the first mode. The battery voltage 1040 and the output voltage VDD_speaker 1060 remains stable. The value of the VDD_speaker voltage 1060 remains constant as long as the battery voltage 1040 remains constant. The FSM 818 520 receives a selection signal QTZ from the dynamic ratio selector 530. The FSM 818 generates a control signal based on the selection signal QTZ to operate the charge pump. The selection signal QTZ may be a digital number, for example if the digital battery voltage is 194, then QTZ is 582 then the FSM generates a control signal for example MODE3X for operating the charge pump with a conversion ratio of 3× the battery voltage.

At time t1, the battery voltage 1040 decreases; as a result, the output signal 1070 of the multiplier and the voltage VDD_speaker 1060 drop rapidly. The slewer 814 identifies that the variation of the signal 1070 (N*dVbat/dt) is equal or greater than a certain threshold value. The slewer sends the slewing signal 1030 to the multiplexer 819. The multiplexer 819 now selects a first channel connected to the output of the comparator 816 and the circuit 800 operates in the second mode. The slewer 814 generates a first slope signal 1082 having a negative slope, and the comparator 816 then compares VDD_speaker 1060 with the slope signal 1082. At time t1, VDD_speaker 1060 is lower than the slope signal 1082; as a result, the comparator 816 increases the regulator signal 1010 from a logic low to a logic high value. The FSM 818 receives the regulator signal 1010 via the multiplexer 819 and increases the ratio from 3× the battery voltage to 4× the battery voltage. As a consequence, VDD_speaker 1060 increases.

At the time t2, VDD_speaker 1060 is greater than the slope signal 1082 and the regulation signal 1010 decreases from a logic high to a logic low. The control signal or operating ratio signal 1020 now operates the charge pump with a 3× ratio.

Between the times t2 and t6, VDD_speaker 1060 oscillates around the first slope signal 1082. Eventually at time t6, the slewing signal 1030 goes low and the control signal 1020 is maintained with a 3× conversion ratio.

Between the times t6 and t7, the circuit 800 operates in the first mode. At time t7, the battery voltage 1040 increases back to its former value. This variation in battery voltage is detected by the slewer 814 which increases the slewing signal 1030 from a logic low to a logic high. The multiplexer 819 then selects the first channel connected to the output of the comparator 816 and the circuit 800 operates in the second mode. The slewer 814 generates a second slope signal 1084 having a positive slope, and the comparator 816 then compares VDD_speaker 1060 with the second slope signal 1084. At time t7, VDD_speaker 1060 is greater than the slope signal 1084; as a result, the comparator 816 increases the regulator signal 1010 from a logic low to a logic high value. The FSM 818 receives the regulator signal 1010 via the multiplexer 819 and decreases the ratio from 3× the battery voltage to 2× the battery voltage. As a consequence, VDD_speaker 1060 decreases.

Between the times t7 and t12, VDD_speaker 1060 oscillates around the second slope signal 1084. Eventually at time t13, the slewing signal 1030 goes low and the quantized signal 1020 is maintained with a conversion ratio of 3× the battery voltage. The circuit returns to the first mode of operation.

Figure 11:
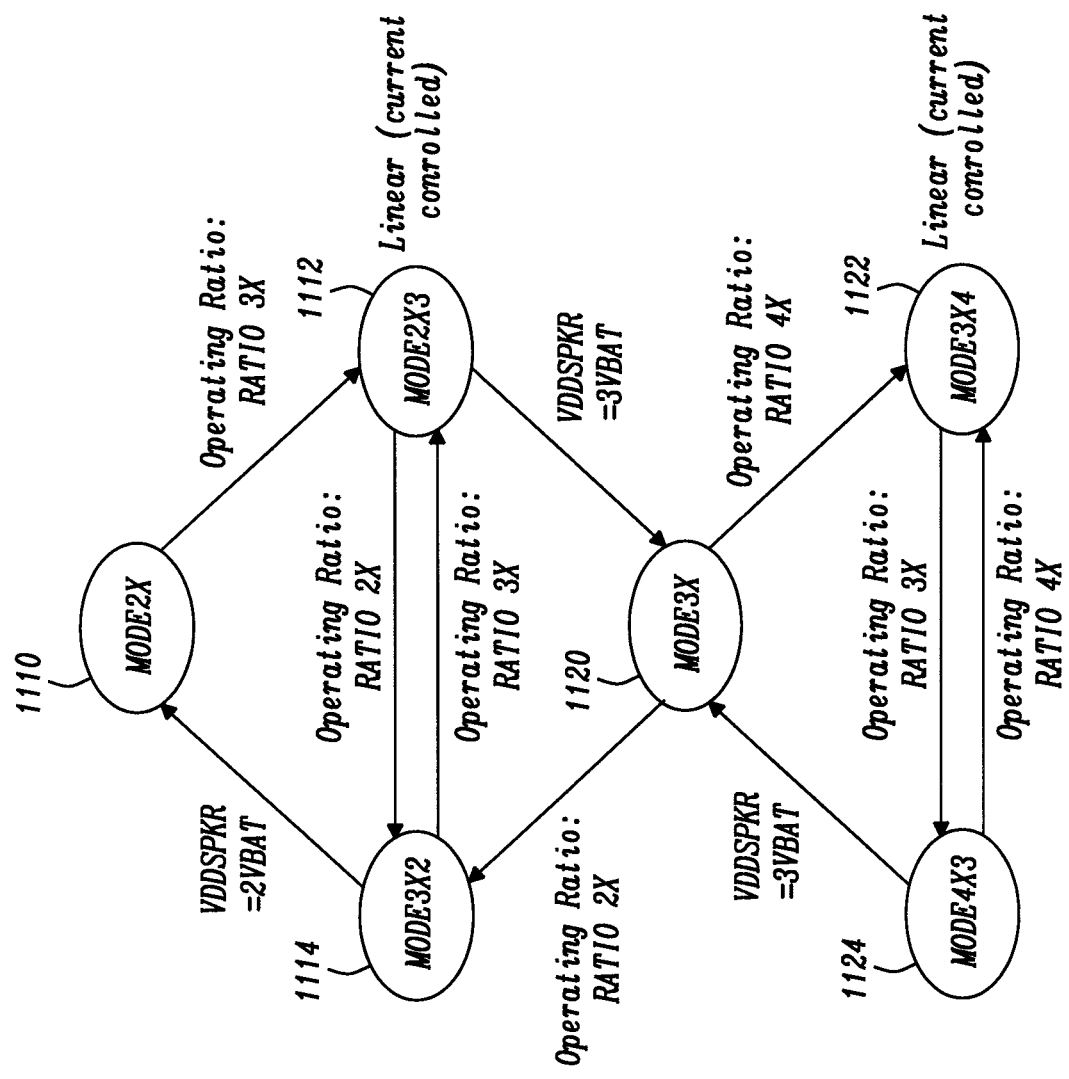
FIG. 11 is a charge pump state diagram.

FIG. 11 illustrates a charge pump state diagram. As mentioned above, the final state machine 818 described with reference to FIG. 8, may store several modes for operating the charge pump. It will be appreciated that the FSM 814 may store many different modes and is not limited to the representation illustrated in FIG. 11.

The diagram of FIG. 11 shows six different modes, including two integer modes 1110 and 1120 and four transition modes, 1112, 1114, 1122 and 1124. For instance, the mode 2× 1110 corresponds to a mode in which the charge pump generates an output voltage that is twice the input voltage; in other words, the conversion rate is 2. Similarly, the mode 3× 1120 corresponds to a mode in which the charge pump generates an output voltage of three times the input voltage, that is to say the conversion rate is 3.

The transition between the mode 2× 1110 and the mode 3× 1120 is not spontaneous and requires a transition period during which the charge pump is operating in a transition mode. For instance, when passing from the mode 2× 1110 to the mode 3× 1120, the charge pump operates for a certain time in the transition mode 2×3 1112.

It will be appreciated that the charge pump 520 of the circuit of FIGS. 5 and 8 may be implemented in different fashions. For instance, the charge pump 520 may include a plurality of switches and capacitors activated with a plurality of drive signals. An adaptive table may be provided to generate the drive signals based on the control signal generated by the FSM.

A skilled person will appreciate that variations of the disclosed arrangements are possible without departing from the disclosure. For instance, it will be appreciated that the circuits of FIGS. 5 and 8 may be implemented in analog or digital forms. Accordingly, the above description of the specific embodiment is made by way of example only and not for the purposes of limitation. It will be clear to the skilled person that minor modifications may be made without significant changes to the operation described.

What is claimed is:

1. A method of controlling a charge pump for converting an input voltage into an output voltage with a conversion ratio, the charge pump being operable in a plurality of modes corresponding to different conversion ratios, the method comprising the steps of:
   identifying a target value of the output voltage;
   calculating a product of the conversion ratio and the input voltage;
   comparing the product with the target value; and
   selecting a mode of operation of the charge pump by increasing or decreasing the conversion ratio based on the comparison; and maintaining the conversion ratio associated with the selected mode of operation for a length of time before decreasing the conversion ratio.

2. The method as claimed in claim 1, wherein the conversion ratio is an integer.

3. The method as claimed in claim 2, further comprising the steps of: identifying a plurality of products for different values of the conversion ratio, and selecting a conversion ratio associated with a product that is the closest to the target value.

4. The method as claimed in claim 1, wherein the target value varies with time and wherein identifying the target value comprises sensing a source signal to estimate the target value.

5. The method as claimed in claim 4, further comprising the step of: recording amplitude maxima of the source signal.

6. The method as claimed in claim 1, further comprising the step of: calculating a ratio of the product over the target value to select the mode of operation.

7. The method as claimed in claim 1, the method further comprising the steps of:
   detecting a rate of change of an input signal function of the input voltage; and
   upon identifying that a magnitude of the rate of change has crossed a threshold value, generating a reference signal, comparing the output voltage with the reference signal; and selecting a mode of operation of the charge pump based on the comparison.

8. The method as claimed in claim 7, wherein the reference signal is varying with a rate of change that is less than a rate of change of the input signal.

9. A charge pump controller for controlling a charge pump adapted to convert an input voltage into an output voltage with a conversion ratio, the charge pump being operable in a plurality of modes corresponding to different conversion ratios, the controller comprising
- a first selector for selecting a mode of operation of the charge pump; the first selector comprising a first input for coupling to a voltage supply providing the input voltage; and a second input for coupling to a source signal; the first selector being configured to
- identify a target value of the output voltage;
- calculate a product of the conversion ratio and the input voltage;
- compare the product with the target value; and
- select a mode of operation of the charge pump by increasing or decreasing the conversion ratio based on the comparison, and maintaining the conversion ratio associated with the selected mode of operation for a length of time before decreasing the conversion ratio.

10. The charge pump controller as claimed in claim 9 wherein the conversion ratio is an integer; and wherein the first selector is configured to identify a plurality of products for different values of the conversion ratio, and to select a conversion ratio associated with a product that is the closest to the target value.

11. The charge pump controller as claimed in claim 9, wherein the first selector is configured to calculate the target value based on the source signal.

12. The charge pump controller as claimed in claim 11, wherein the first selector is configured to record amplitude maxima of the source signal.

13. The charge pump controller as claimed in claim 9 further comprising
- a slew rate detector adapted to detect a rate of change of an input signal function of the input voltage and to generate a reference signal upon identifying that a magnitude of the rate of change has crossed a threshold value;
- a comparator adapted to compare the output voltage with the reference signal; and
- a second selector to select a mode of operation of the charge pump based on the comparison.

14. The charge pump controller as claimed in claim 13, further comprising a multiplexer having a first channel coupled to the first selector and a second channel couple to the comparator; the multiplexer being adapted to select the first channel upon receipt of a signal from the slew rate detector.

15. The charge pump controller as claimed in claim 13, further comprising a sensor coupled to the slew rate detector; the sensor being adapted to sense an amplitude of the source signal and to enable the slew rate detector upon identifying that the amplitude is below a certain value.

16. An audio system comprising a charge pump controller as claimed in claim 9 coupled to a charge pump and an amplifier coupled to the charge pump for amplifying the source signal; wherein the source signal is an audio signal.

17. The audio system as claimed in claim 16 comprising a processor for processing the audio signal, wherein the first selector of the charge pump controller is connected to the processor.

* * * * *